(12) United States Patent
Zhu et al.

(10) Patent No.: US 12,159,179 B2
(45) Date of Patent: Dec. 3, 2024

(54) THREE-DIMENSIONAL INTEGRATED SYSTEM OF RFID CHIP AND SUPER CAPACITOR AND PREPARATION METHOD THEREOF

(71) Applicants: FUDAN UNIVERSITY, Shanghai (CN); SHANGHAI INTEGRATED CIRCUIT MANUFACTURING INNOVATION CENTER CO., LTD, Shanghai (CN)

(72) Inventors: Bao Zhu, Shanghai (CN); Lin Chen, Shanghai (CN); Qingqing Sun, Shanghai (CN); Wei Zhang, Shanghai (CN)

(73) Assignees: Fudan University, Shanghai (CN); Shanghai Integrated Circuit Manuvacturing Innovation Center Co., Ltd, Shanghai (CN)

( * ) Notice: Subject to any disclaimer, the term of this patent is extended or adjusted under 35 U.S.C. 154(b) by 756 days.

(21) Appl. No.: 17/052,858

(22) PCT Filed: Jul. 2, 2020

(86) PCT No.: PCT/CN2020/099994
§ 371 (c)(1),
(2) Date: Apr. 23, 2021

(87) PCT Pub. No.: WO2022/000436
PCT Pub. Date: Jan. 6, 2022

(65) Prior Publication Data
US 2023/0095639 A1    Mar. 30, 2023

(30) Foreign Application Priority Data
Jun. 30, 2020  (CN) .......................... 202010618775.0

(51) Int. Cl.
*G06K 19/077*   (2006.01)
*H01G 11/08*    (2013.01)

(52) U.S. Cl.
CPC ......... *G06K 19/0772* (2013.01); *H01G 11/08* (2013.01)

(58) Field of Classification Search
CPC . H01L 2924/30105; H01L 2924/19041; H01L 28/40; H01L 23/642;
(Continued)

(56) References Cited

U.S. PATENT DOCUMENTS

2012/0056002 A1*  3/2012  Ritamaki ......... G06K 19/07786
                                              235/492
2017/0092566 A1*  3/2017  Biederman ........... H01L 23/481
(Continued)

FOREIGN PATENT DOCUMENTS

CN        102460479 A       5/2012
CN        104024573 B  *    5/2018   ........... E21B 17/003
(Continued)

OTHER PUBLICATIONS

Choudhary, "Asymmetric Supercapacitor Electrodes and Devices" (Year: 2017).*
Borenstein, "Carbon-based composite materials for supercapacitor electrodes: a review" (Year: 2017).*
Written Opinion of the International Searching Authority and International Search Report for PCT Application No. PCT/CN2020/099994, China National Intellectual Property Administration; Beijing, China; date of mailing Dec. 25, 2020.
(Continued)

*Primary Examiner* — Thien T Mai
(74) *Attorney, Agent, or Firm* — Thomas E. Lees, LLC

(57) ABSTRACT

The present disclosure discloses a three-dimensional integration system of an RFID chip and a supercapacitor and a manufacturing method thereof. The three-dimensional integration system of an RFID chip and a supercapacitor includes: a silicon substrate (200); an RFID chip (201) disposed on a front surface of the silicon substrate (200); a supercapacitor disposed on a back surface of the silicon substrate (200) at a position corresponding to the RFID chip
(Continued)

(201), but not in contact with the RFID chip (201); through silicon via structures penetrating the silicon substrate (200) and respectively disposed on two sides of the RFID chip (201); wherein the RFID chip (201) has a chip positive electrode (2021) and a chip negative electrode (2022) electrically connected with a capacitor contact positive electrode (2131) and a capacitor contact negative electrode (2132) of the supercapacitor through the through silicon via structures on the two sides respectively; and a packaging substrate (218) electrically connected to the capacitor contact positive electrode (2131) and the capacitor contact negative electrode (2132).

4 Claims, 12 Drawing Sheets

(58) Field of Classification Search
CPC ............ H01L 27/1255; H01L 23/5223; H01L 27/0733; H01G 11/08; H01G 4/35; H01G 4/385; H01G 4/30; H01G 11/50; G06K 19/07756; G06K 19/0772; G06K 19/07722; G06K 19/07
See application file for complete search history.

(56) References Cited

U.S. PATENT DOCUMENTS

| | | |
|---|---|---|
| 2019/0325284 A1 | 10/2019 | Forster |
| 2023/0095639 A1* | 3/2023 | Zhu .................. H01G 11/08 607/1 |

FOREIGN PATENT DOCUMENTS

| | | | | |
|---|---|---|---|---|
| CN | 108028435 A | | 5/2018 | |
| CN | 108538821 A | * | 9/2018 | ............ H01G 11/00 |
| CN | 110098065 A | | 8/2019 | |
| CN | 110931459 A | | 3/2020 | |
| KR | 102123746 B1 | | 6/2020 | |
| WO | 2014066824 A1 | | 5/2014 | |

OTHER PUBLICATIONS

Chinese first Office action and search report for Chinese Patent Application No. 202010618775.0; China National Intellectual Property Administration; Beijing, China; dated Sep. 22, 2023.

* cited by examiner

THREE-DIMENSIONAL INTEGRATED SYSTEM OF RFID CHIP AND SUPER CAPACITOR AND PREPARATION METHOD THEREOF

TECHNICAL FIELD

The present disclosure belongs to the field of integrated circuit packaging, and more particularly, relates to a three-dimensional integration system of an RFID chip and a supercapacitor and a manufacturing method thereof.

BACKGROUND

Radio Frequency identification (RFID) is a kind of automatic identification technology, which uses radio frequency to carry out non-contact two-way data communication, uses radio frequency to read and write recording media (electronic tags or radio frequency cards) to achieve the purpose of identifying targets and data exchanges, and is considered to be one of the most promising information technologies in the 21st century. In order to manage a sleep mode of an RFID chip, micro-batteries are a good choice due to their relatively high energy density. However, considering energy management of an active mode of data transmission, micro-batteries have disadvantages in terms of power density and cycle life. By contrast, a supercapacitor has a high power density and cycle life, and thus can ensure high-speed and stable data transmission. Conventionally, a supercapacitor and an RFID chip can be disposed on the same packaging substrate, and the supercapacitor and the RFID chip can be electrically connected by means of metal wire bonding. However, this packaging method not only takes up a large amount of area on the substrate and affects the packaging density; but also lowers the data transmission speed and energy supply efficiency due to the use of long metal wire. Therefore, in order to reduce the size of the RFID chip and ensure the local transmission of energy, there is a demand to adopt a CMOS-compatible process to integrate the supercapacitor and the RFID chip on the same wafer.

SUMMARY

In order to solve the above problems, the present disclosure discloses a three-dimensional integration system of an RFID chip and a supercapacitor, including: a silicon substrate; an RFID chip disposed on a front surface of the silicon substrate; and a supercapacitor disposed on a back surface of the silicon substrate at a position corresponding to the RFID chip, but not in contact with the RFID chip; through silicon via structures penetrating the silicon substrate and respectively disposed on two sides of the RFID chip, wherein the RFID chip has a chip positive electrode and a chip negative electrode electrically connected with a capacitor contact positive electrode and a capacitor contact negative electrode of the supercapacitor through the through silicon via structures on the two sides respectively; and a packaging substrate electrically connected to the capacitor contact positive electrode and the capacitor contact negative electrode.

In the three-dimensional integration system of an RFID chip and a supercapacitor of the present disclosure, preferably, the through silicon via structures include: a through silicon via; a first insulating dielectric, a first copper diffusion barrier layer and a conductive copper pillar, wherein the first insulating dielectric covers sidewalls of the through silicon via and an upper surface of the silicon substrate except a surface of the RFID chip; the first copper diffusion barrier layer covers the first insulating dielectric; the conductive copper pillar covers the first copper diffusion layer on either side, and completely fills the through silicon via, the top of the conductive copper pillar is flush with the top of the first copper diffusion barrier layer; and a third insulating dielectric, a copper diffusion barrier layer/seed layer stack and a copper film, wherein the third insulating dielectric forms openings on the surfaces of the conductive copper pillar, the chip positive electrode, and the chip negative electrode; the copper diffusion barrier layer/seed layer stack on the two sides respectively covers the surfaces of the chip positive electrode and a left area of the chip positive electrode, and the surfaces of the chip negative electrode and a right area of the chip negative electrode; the copper film respectively covers the surface of the copper diffusion barrier layer/seed layer stack on the two sides; the copper diffusion barrier layer/seed layer stack and the copper film on the left are electrically connected to the conductive copper pillar on the left and the chip positive electrode; the copper diffusion barrier layer/seed layer stack and the copper film on the right are electrically connected to the conductive copper pillar on the right and the chip negative electrode.

In the three-dimensional integration system of an RFID chip and a supercapacitor of the present disclosure, preferably, the supercapacitor includes: a silicon nanopore structure; a second insulating dielectric covering the surface of the silicon nanopore structure; a current collector covering the surface of the second insulating dielectric; pseudocapacitance material covering the surface of the current collector; and a solid electrolyte covering the surface of the pseudocapacitance material and completely filling silicon nanopores, wherein the current collector and the pseudocapacitance material are separated in the middle area of the silicon nanopore structure, so that the supercapacitor is divided into two electrode areas; the second insulating dielectric also covers the back area of the silicon substrate except the bottoms of the conductive copper pillars; the current collectors on the two sides also respectively cover the bottom areas of the conductive copper pillars; the capacitor contact positive electrode and the capacitor contact negative electrode are respectively disposed on the surfaces of the current collectors under the conductive copper pillars on the two sides.

In the three-dimensional integration system of an MD chip and a supercapacitor of the present disclosure, preferably, the current collector is at least one of a TaN/Ru stack, a TaN/Co stack, and a TaN/Ta/Cu stack.

In the three-dimensional integration system of an RFID chip and a supercapacitor of the present disclosure, preferably, the pseudocapacitance material is at least one of NiO, MnO, $RuO_2$, $In_2O_3$, $MoO_3$, $V_2O_5$, and $SnO_2$.

The present disclosure also discloses a manufacturing method of a three-dimensional integration system of an RFID chip and a supercapacitor, which includes the following steps: fabricating an RFID chip on a front surface of a silicon substrate; thinning the silicon substrate, and forming an etch stop layer and a copper seed layer on a back surface of the silicon substrate; etching through silicon vias respectively on two sides of the RFID chip, and performing first wiring in the through silicon vias to form through silicon via structures; fabricating a supercapacitor on the back surface of the silicon substrate; performing second wiring so that a capacitor contact positive electrode and a capacitor contact negative electrode of the supercapacitor are electrically connected with a chip positive electrode and a chip negative electrode of the RFID chip respectively through the through silicon via structures on the two sides; and electrically connecting the capacitor contact positive electrode and the capacitor contact negative electrode to a packaging substrate.

In the manufacturing method of a three-dimensional integration system of an RFID chip and a supercapacitor of the present disclosure, preferably, the step of performing first wiring in the through silicon vias specifically includes: for each of the through silicon vias, forming a first insulating dielectric on the surface of the through silicon via, and removing the first insulating dielectric on the bottom of the through silicon via by photolithography and etching; forming a copper diffusion barrier layer, and removing the first copper diffusion barrier layer on the bottom of the through silicon via by photolithography and etching; removing the etch stop layer on the bottom of the through silicon via by photolithography and etching, to expose the seed layer; electroplating copper on the surface of the seed layer to completely fill the through silicon via and to have a top flush with the top of the first copper diffusion barrier layer, as a conductive copper pillar; and removing the seed layer, the etch stop layer and part of the conductive copper pillar on the bottom of the silicon substrate by a chemical mechanical polishing process.

In the manufacturing method of a three-dimensional integration system of an RFID chip and a supercapacitor of the present disclosure, preferably, the step of fabricating a supercapacitor specifically includes: forming silicon nanopores on the back surface of the silicon substrate by photolithography and etching; forming a second insulating dielectric in the silicon nanopores; removing the second insulating dielectric on the bottoms of the conductive copper pillars by photolithography and etching; depositing a current collector and pseudocapacitance material to form the supercapacitor; removing the pseudocapacitance material and current collector in the middle area of the silicon nanopores and the pseudocapacitance material on the bottoms of the through silicon vias by a photolithography and etching process, to form two areas that are not connected to each other; and forming the capacitor contact positive electrode and the capacitor contact negative electrode of the supercapacitor on the surface of the current collector directly under the conductive copper pillars respectively.

In the manufacturing method of a three-dimensional integration system of an RFID chip and a supercapacitor of the present disclosure, preferably, the step of performing second wiring specifically includes: forming a third insulating dielectric on the front surface of the silicon substrate; removing the third insulating dielectric on the surfaces of the conductive copper pillars, the chip positive electrode and the chip negative electrode by photolithography and etching; forming a copper diffusion barrier layer/seed layer stack, and electroplating a copper film; and removing the copper film and the copper diffusion barrier layer/seed layer stack between the chip positive electrode and the chip negative electrode.

In the manufacturing method of a three-dimensional integration system of an RFID chip and a supercapacitor of the present disclosure, preferably, the current collector is at least one of a TaN/Ru stack, a TaN/Co stack, and a TaN/Ta/Cu stack; and the pseudocapacitance material is at least one of NiO, MnO, $RuO_2$, $In_2O_3$, $MoO_3$, $V_3O_5$, and $SnO_2$.

In the present disclosure, the RFID chip and the supercapacitor are integrated on the front and back surfaces of the same wafer, and through silicon vias are utilized to electrically connect the RFID chip and the supercapacitor. Thus, it can effectively reduce the area occupied by the RFID chip and the supercapacitor as a whole, increase the data transmission speed of the RFID chip and improve the effectiveness of the energy supply of the supercapacitor.

DETAILED DESCRIPTION OF THE EMBODIMENTS

Figure 1:
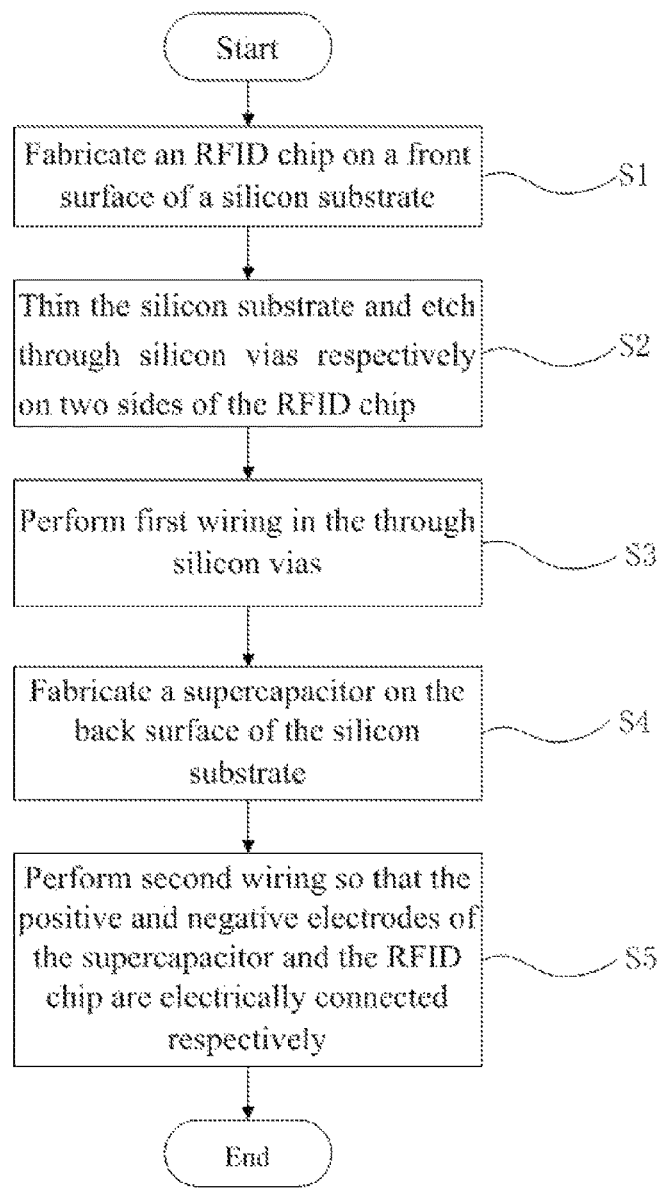
FIG. 1 is a flowchart of a manufacturing method of a three-dimensional integration system of an RFID chip and a supercapacitor according to the present disclosure.

In order to make the objectives, technical solutions, and advantages of the present disclosure clearer, the technical solutions in the embodiments of the present disclosure will be described clearly and completely below with reference to the accompanying drawings of the embodiments of the present disclosure. It should be understood that the specific embodiments described are only used to explain the present disclosure, but not used to limit the present disclosure. The described embodiments are only a part of the embodiments of the present disclosure, rather than all the embodiments. Based on the embodiments of the present disclosure, all other embodiments obtained by those of ordinary skill in the art without creative work shall fall within the protection scope of the present disclosure.

In the description of the present disclosure, it should be noted that the orientation or positional relationship indicated by terms "upper", "lower", "vertical", "horizontal", or the like, are based on the orientation or positional relationship shown in the drawings, and are only for convenience and simplification of description of the present disclosure, rather than indicating or implying that the device or element referred to must have a specific orientation, be constructed and operated in a specific orientation, and therefore cannot be understood as a limitation of the present disclosure. In addition, the terms "first" and "second" are only used for descriptive purposes, and cannot be understood as indicating or implying relative importance.

In addition, many specific details of the present disclosure will be described below, such as the structure, materials, dimensions, processing technics and technology of the device, in order to understand the present disclosure more clearly. However, as those skilled in the art can understand, the present disclosure may not be implemented according to these specific details. Unless specifically indicated in the following, each part of the device may be composed of materials known to those skilled in the art, or materials with similar functions developed in the future may be used.

The technical solution of the present disclosure will be further described below in conjunction with FIGS. 1-22 and the embodiments. FIG. 1 is a flowchart of a manufacturing method of a three-dimensional integration system of an RFID chip and a supercapacitor, and FIGS. 2-22 show schematic diagrams of the various steps of the manufacturing method of a three-dimensional integration system of an RFID chip and a supercapacitor. As shown in FIG. 1, the specific preparation steps are as follows.

Figure 2:
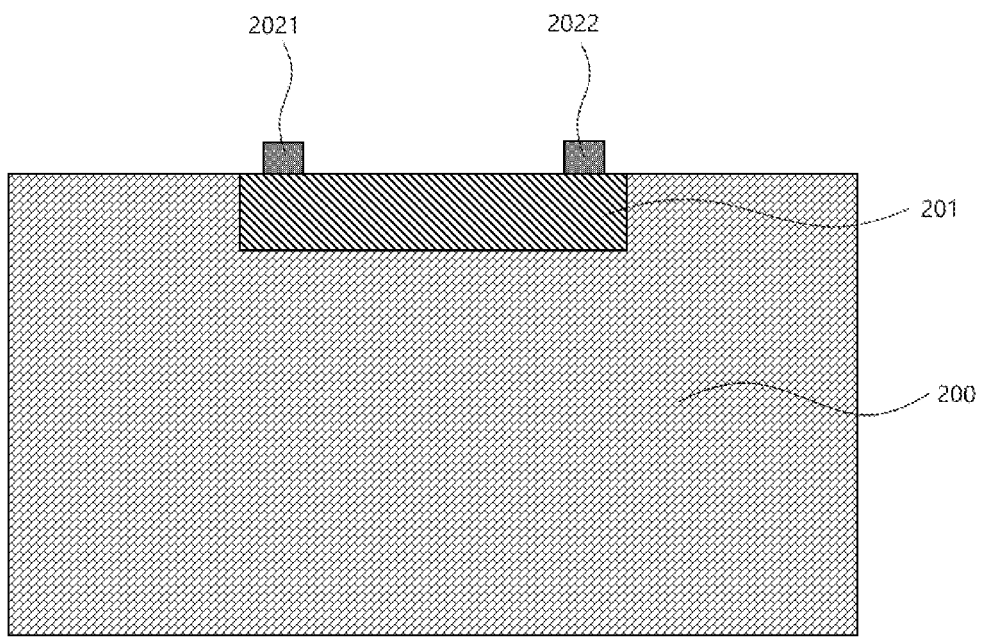
FIGS. 2-22 are schematic diagrams of various steps of the manufacturing method of a three-dimensional integration system of an RFID chip and a supercapacitor according to the present disclosure.

At step S1, an RFID chip is fabricated on a front surface of a silicon substrate. First, an RFID chip 201 is fabricated on a front surface of a silicon substrate 200 by a standard CMOS process. Then, a chip positive electrode 2021 and a chip negative electrode 2022 are respectively led out on a surface of the RFID chip 201, and the resulting structure is shown in FIG. 2.

Figure 3:
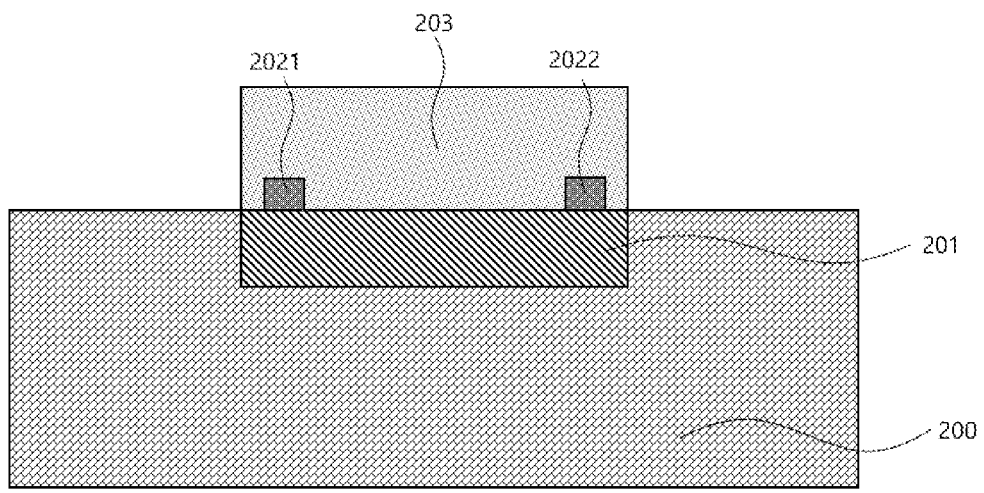

At step S2, the silicon substrate is thinned and through silicon vias are etched respectively on two sides of the RFID chip. First, a ceramic film is attached with an adhesive to the surface of the RFID chip 201 as a first support carrier 203. Then, the silicon substrate 200 is thinned by mechanical grinding and chemical mechanical polishing, and the resulting structure is shown in FIG. 3.

Figure 4:
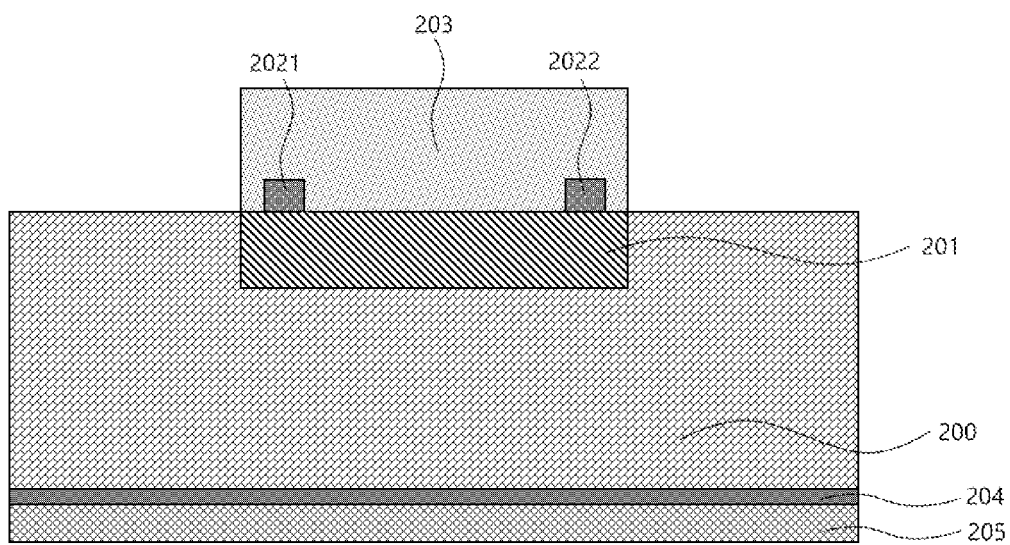

Next, a physical vapor deposition process is performed to sequentially deposit a layer of $Si_3N_4$ film as an etch stop layer 204 and a layer of Cu film as a seed layer 205 on the bottom of the silicon substrate 200. The resulting structure is shown in FIG. 4. Here, the thickness of the etch stop layer is in the range of 200 to 300 nm, and the thickness of the seed layer is in the range of 10 to 30 nm.

Figure 5:
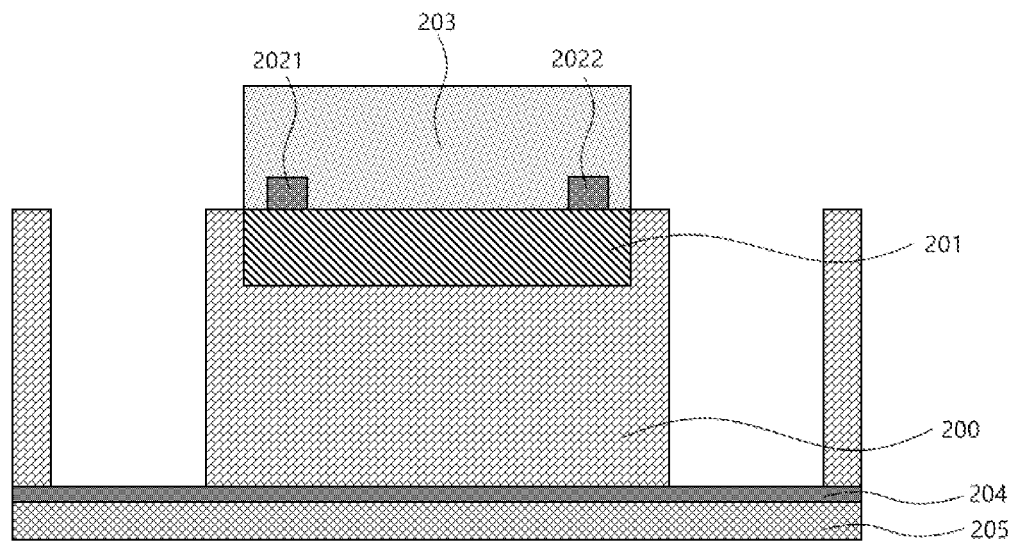

Subsequently, photoresist is spin-coated and the positions of the through silicon vias are defined through an exposure and development process. Next, a deep plasma etching (DRIE) process is performed to etch the silicon substrate 200 on either side of the RFID chip 201 until reaching the etch stop layer $Si_3N_4$ film 204. Finally, the photoresist is dissolved or ashed in a solvent, and the resulting structure is shown in FIG. 5. Here, the plasma for etching the silicon substrate 200 can be at least one of $CF_4$ and $SF_6$. In this embodiment, a deep reactive ion etching process is performed to obtain the through silicon vias. However, the present disclosure is not limited to this, and dry etching such as ion milling etching, plasma etching, reactive ion etching, deep reactive ion etching, and laser ablation, or wet etching using etchant solution can also be selected.

Figure 6:
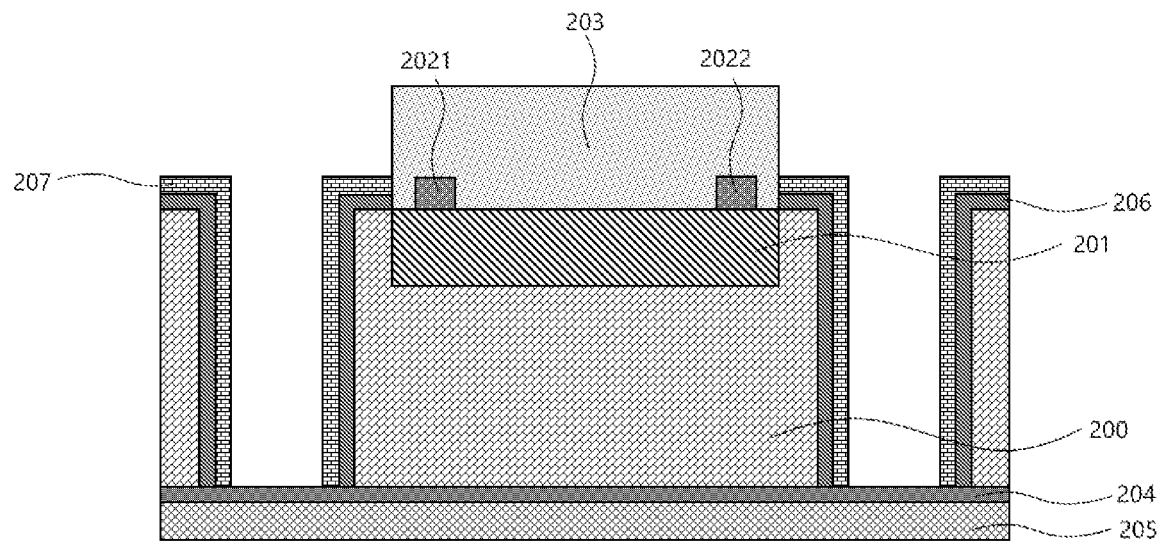
Figure 7:
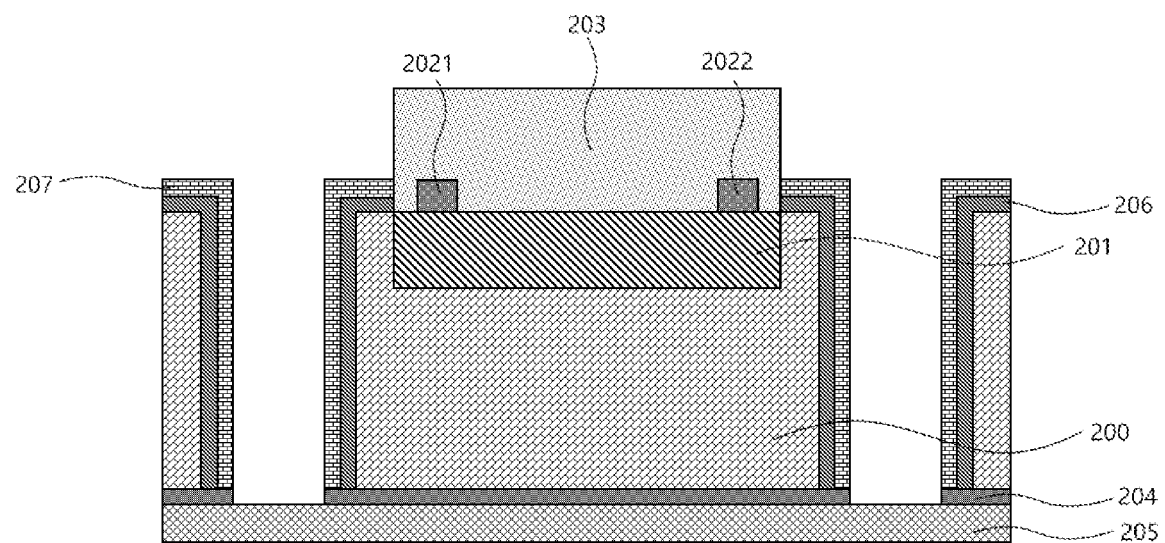
Figure 8:
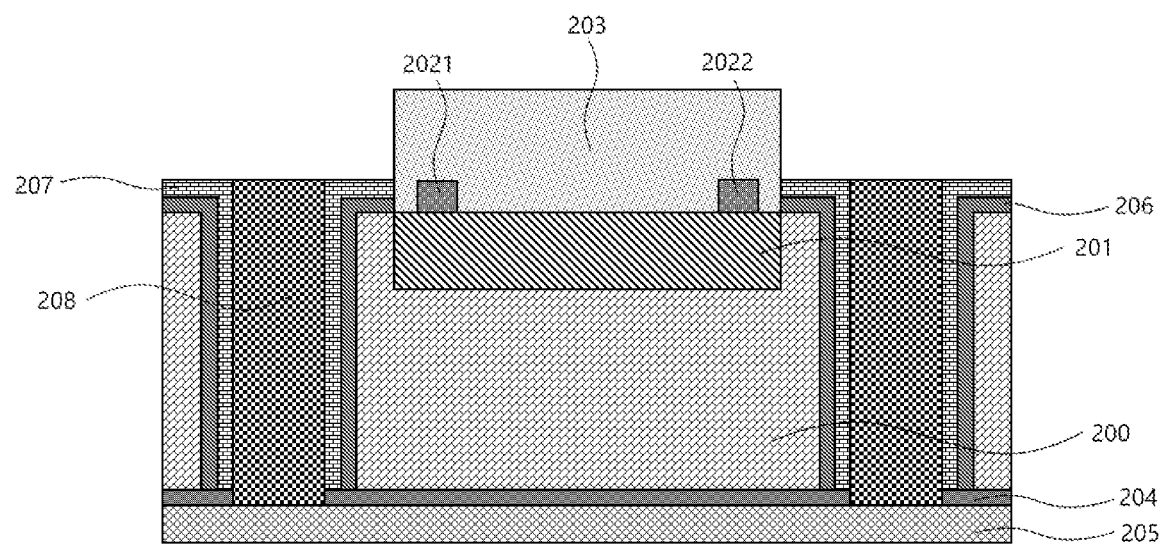
Figure 9:
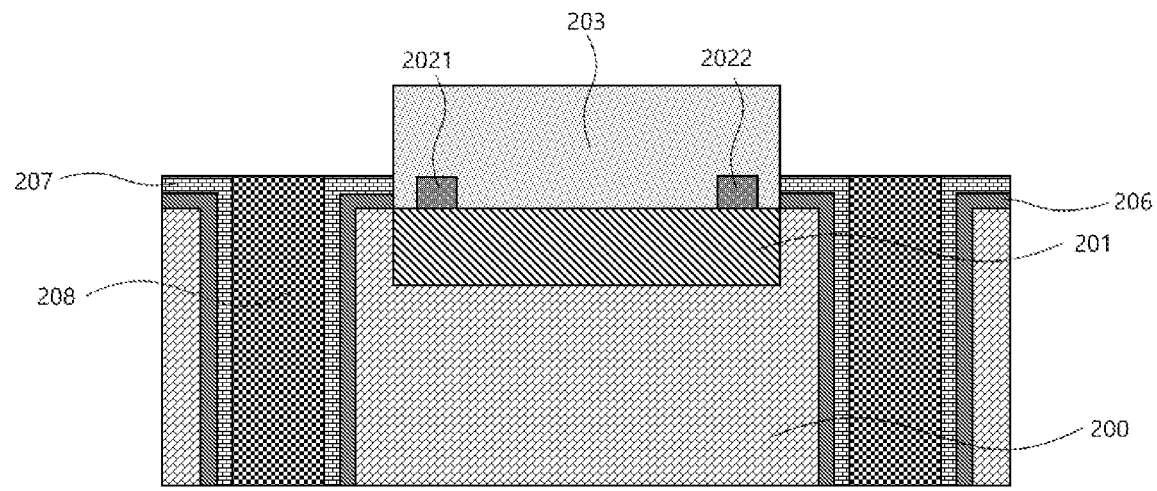

At step S3, first wiring is performed in the through silicon vias to form through silicon via structures. For each of the through silicon vias, first, a chemical vapor deposition process is performed to deposit a layer of $SiO_2$ film as a first insulating dielectric 206 on the surface of the through silicon via. Then, a photolithography and etching process is performed to remove the first insulating dielectric 206 deposited on the bottom of the through silicon via. Next, a physical vapor deposition process is performed to grow a TaN film on the surface of the first insulating dielectric 206 as a first copper diffusion barrier layer 207. Subsequently, a photolithography and etching process is performed to remove the first copper diffusion barrier layer 207 deposited on the bottom of the through silicon via. The resulting structure is shown in FIG. 6. Next, a photolithography and etching process is performed to remove the $Si_3N_4$ film 204 of the etch stop layer on the bottom of the through silicon via. The resulting structure is shown in FIG. 7. Further, using the Cu film 205 as the seed layer, an electroplating process is performed to electroplate copper material inside the silicon through via to form a conductive copper pillar 208, such that the conductive copper pillar 208 completely fills the silicon through via, and the top of the conductive copper pillar 208 is flush with the top of the first copper diffusion barrier layer 207. The resulting structure is shown in FIG. 8. Finally, a chemical mechanical polishing process is performed to remove the seed layer 205, the etch stop layer 204 and part of the conductive copper pillar 208 on the back surface of the silicon substrate 200. The resulting structure is shown in FIG. 9. In this embodiment, $SiO_2$ is used as the first insulating dielectric, and TaN is used as the first copper diffusion barrier layer. However, the present disclosure is not limited to this. At least one of $SiO_2$, $Si_3N_4$, SiON, SiCOH, and SiCOFH can be selected as the first insulating dielectric; at least one of TaN, TiN, ZrN, and $MnSiO_3$ can be selected as the first copper diffusion barrier layer. The growth method of the first insulating dielectric and the first copper diffusion barrier layer can be selected from physical vapor deposition, chemical vapor deposition, atomic layer deposition, and the like.

Figure 10:
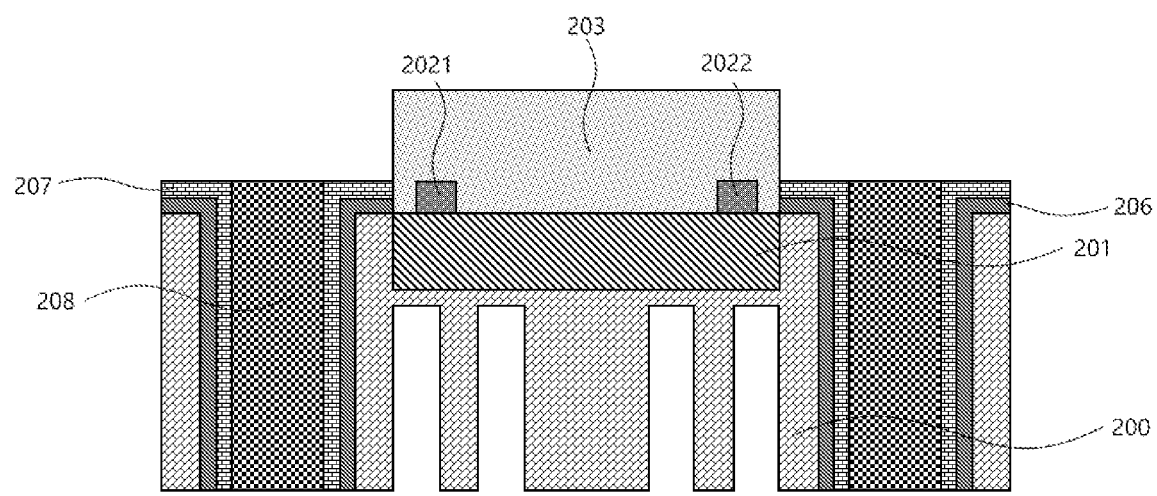
Figure 11:
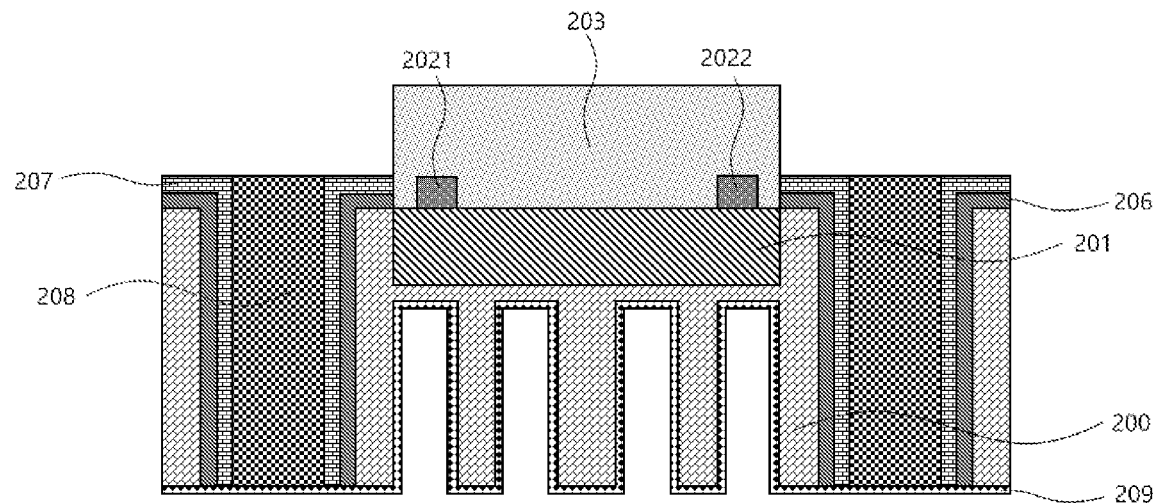
Figure 12:
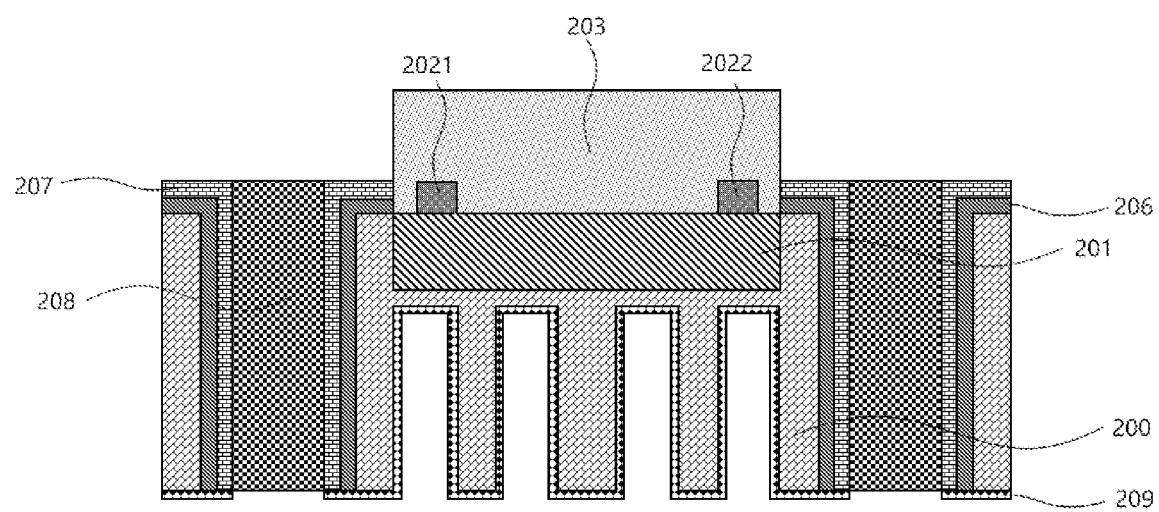

At step S4, a supercapacitor is fabricated on the back surface of the silicon substrate. First, photoresist is spin-coated on the back surface of the silicon substrate 200 and patterns of silicon nanopores are defined by exposure and development processes. Next, a deep plasma etching (DRIE) process is performed to etch the back surface of the silicon substrate 200, to obtain a silicon nanopore structure, and the photoresist is removed by dissolving or aching a solvent. The resulting structure is shown in FIG. 10. The bottom of the silicon nanopore structure is not in contact with the bottom of the RFID chip 201. Then, a chemical vapor deposition process is performed to grow a layer of $SiO_2$ film as a second insulating dielectric 209 on the inside of the silicon nanopores and the back surface of the silicon substrate. The resulting structure is shown in FIG. 11. Next, the second insulating dielectric 209 on the bottoms of the conductive copper pillars 208 is removed by a photolithography and etching process, and the resulting structure is shown in FIG. 12.

Figure 13:
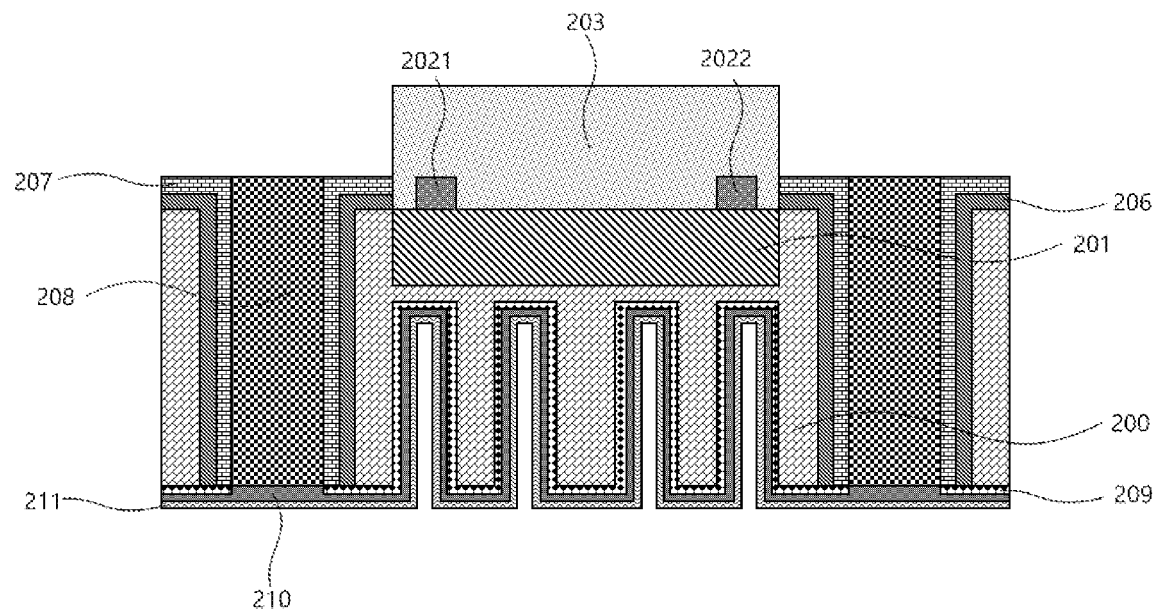

Further, a TaN film, a Ta film, and a Cu film are sequentially deposited on the bottoms of the second insulating dielectric 209 and the conductive copper pillars 208 by a chemical vapor deposition process to form TaN/Ta/Cu stacks as a current collector 210 of the supercapacitor. Subsequently, a chemical vapor deposition process is performed to grow a layer of NiO film as a pseudocapacitance material 211 on the surface of the current collector 210. The resulting structure is shown in FIG. 13.

Figure 14:
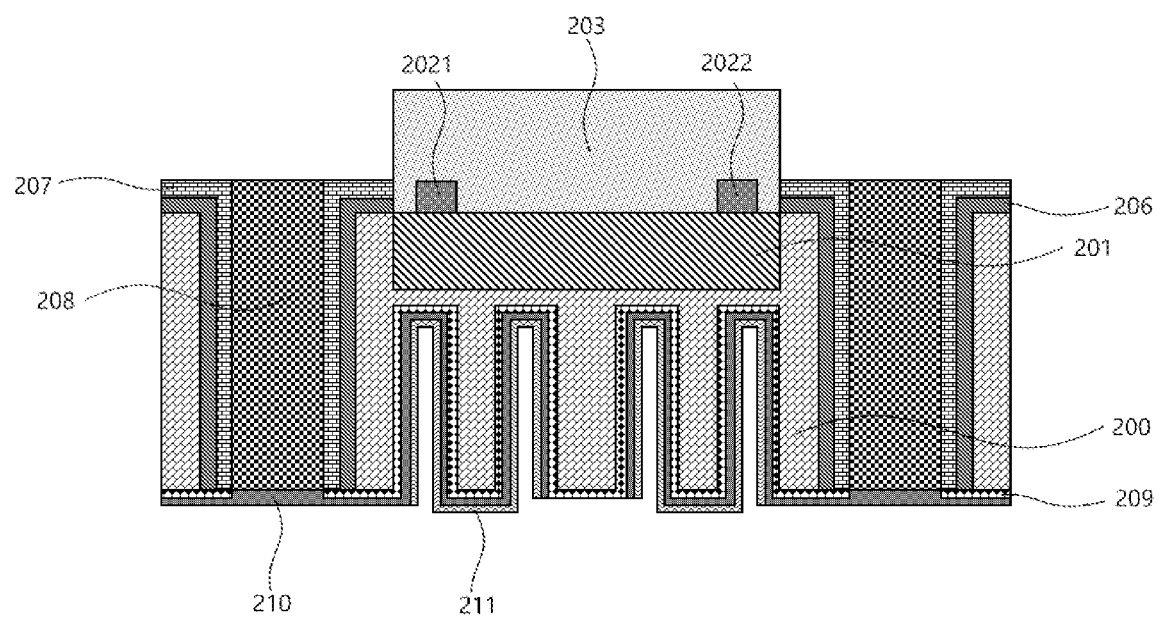
Figure 15:
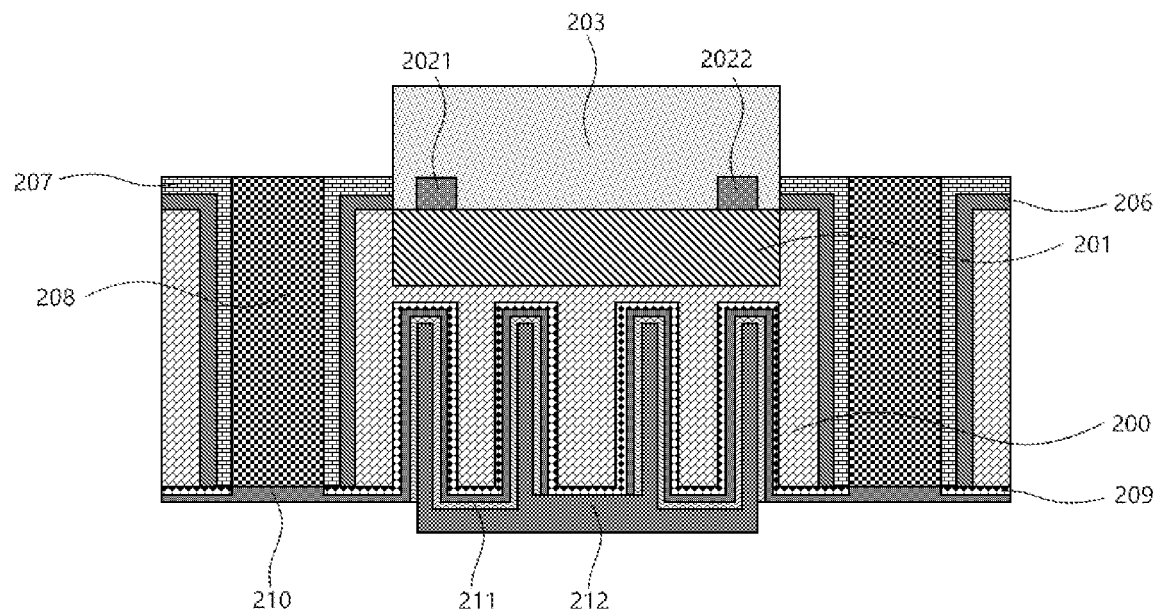

Further, a photolithography and etching process is performed to remove the pseudocapacitance material 211 and the current collector 210 in the middle area of the silicon nanopore structure, and the pseudocapacitance material 211 on the bottoms of the through silicon vias. The resulting structure is shown in FIG. 14. Since the pseudocapacitance material 211 and the current collector 210 in the middle area of the silicon nanopore structure are removed, the electrode formed by the pseudocapacitance material and the current collector is divided into two areas that are not connected to each other. After that, a solid electrolyte 212 composed of polyacryl alcohol (PVA)/potassium hydroxide (KOH) is injected into the silicon nanopores, and the resulting structure is shown in FIG. 15.

Figure 16:
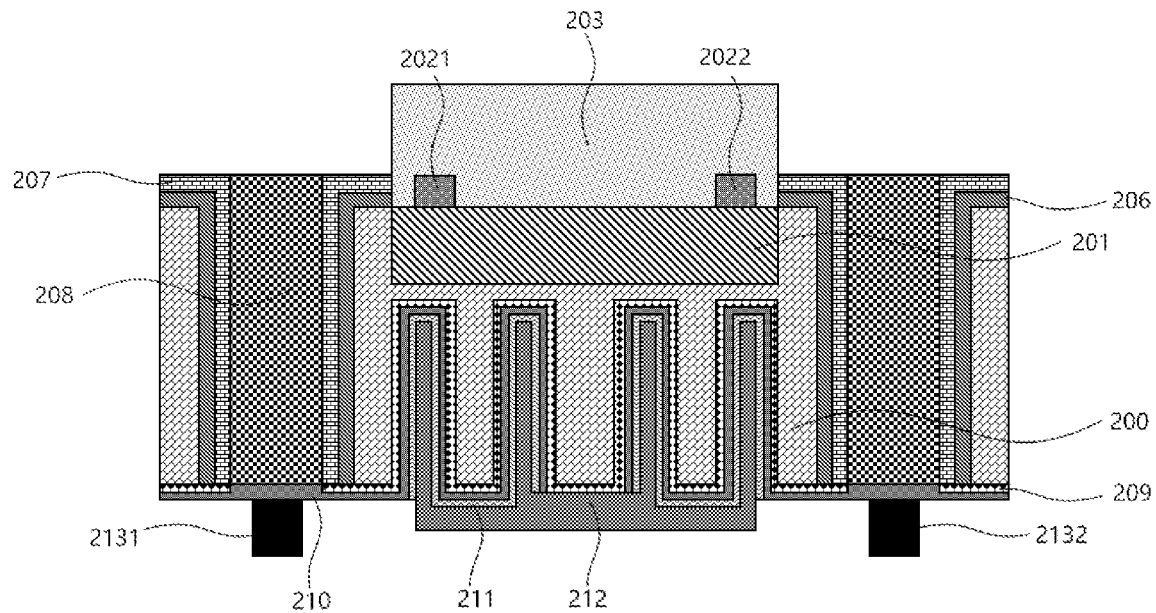

Finally, an electroplating process is performed to electroplate copper material on the surface of the current collector 210 disposed directly under the conductive copper pillars 208 as a capacitor contact positive electrode 2131 and a capacitor contact negative electrode 2132 of the supercapacitor respectively. The resulting structure is shown in FIG. 16. In this embodiment, the $SiO_2$ film is used as a second insulating dielectric, the TaN/Ta/Cu stack is used as the current collector, the NiO film is used as the pseudocapacitance material, and the PVA/KOH is used as the solid electrolyte. However, the present disclosure is not limited to this, at least one of $SiO_2$, $Si_3N_4$, SiON, SiCOH, and SiCOFH can be selected as the second insulating dielectric, at least one of TaN/Ru stack, TaN/Co stack, and TaN/Ta/Cu stack can be selected as the current collector, at least one of NiO, MnO, $RuO_2$, $In_2O_3$, $MoO_3$, $V_2O_5$, and $SnO_5$ can be selected as the pseudocapacitance material, and PVA/KOH or PVA/$H_2SO_4$ can be selected as the solid electrolyte.

Figure 17:
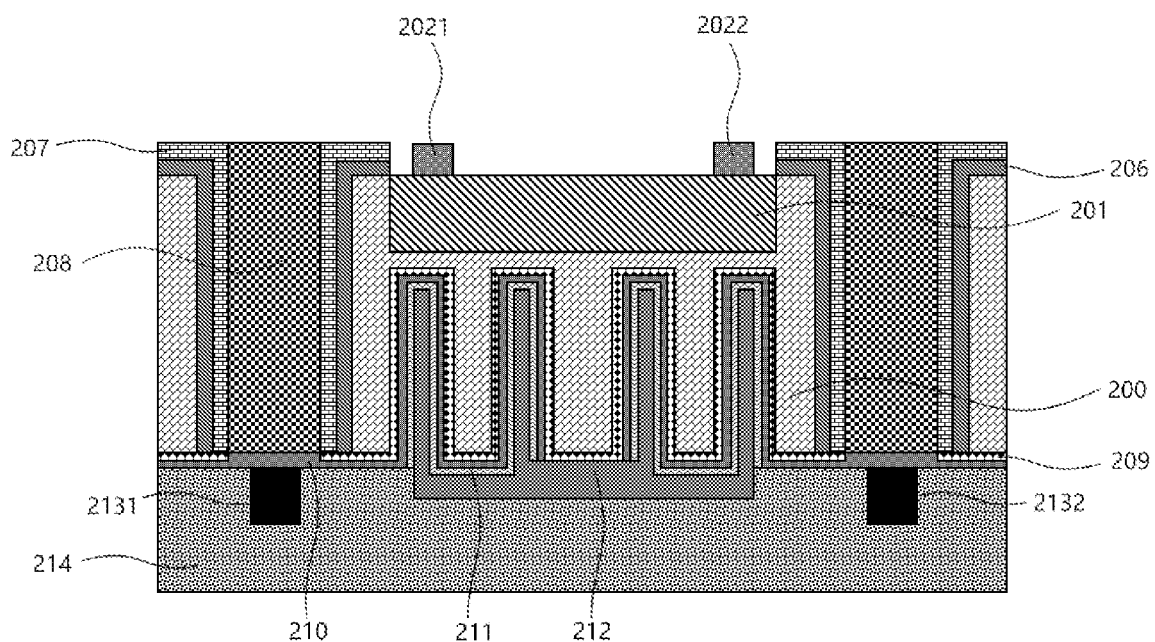

At step S5, second wiring is performed so that the positive and negative electrodes of the supercapacitor and the RFID chip are electrically connected respectively. First, an adhesive is used to adhere a ceramic film as a second support carrier 214 on the back surface of the above structure. Then, the first support carrier 203 is removed, and the resulting structure is shown in FIG. 17.

Figure 18:
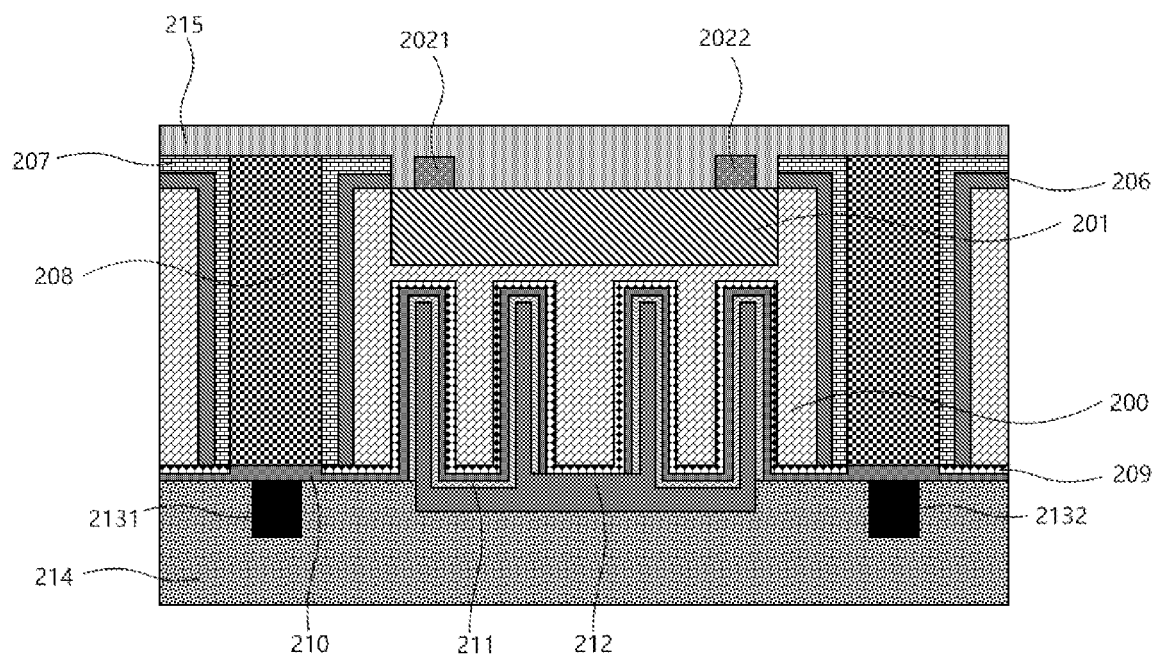

Next, a chemical vapor deposition process is performed to grow a layer $SiO_2$ filar as a third insulating dielectric 215 on the front surface of the above structure. The resulting structure is shown in FIG. 18.

Figure 19:
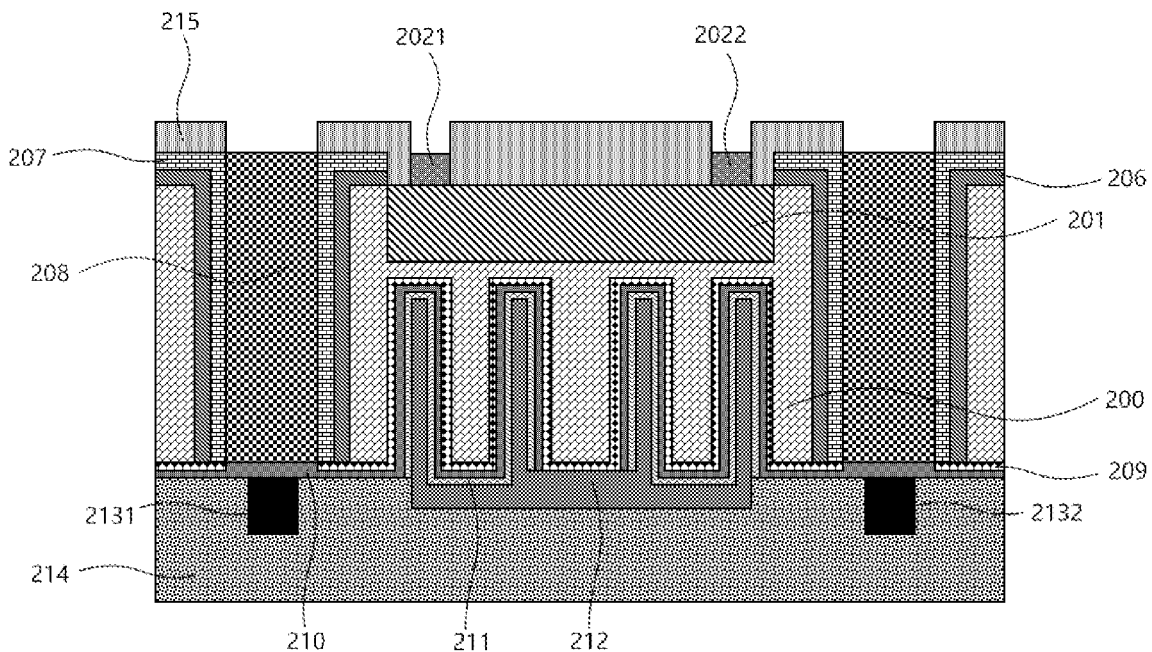

Next, the third insulating dielectric 215 on the surfaces of the conductive copper pillars 208, the chip positive electrode 2021, and the chip negative electrode 2022 are removed by a photolithography and etching process. The resulting structure is shown in FIG. 19.

Figure 20:
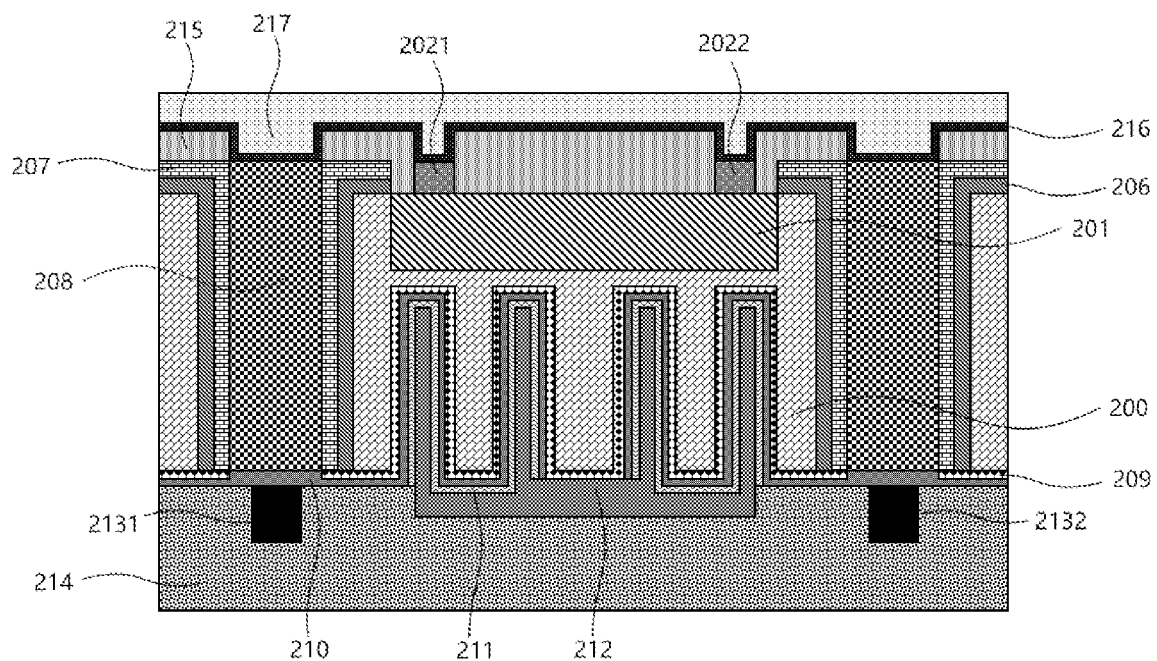

Subsequently, a physical vapor deposition process is performed to sequentially grow a TaN film and a Ru film on the front surface of the above structure as a copper diffusion barrier layer/seed layer stack 216. Further, electroplating is performed to electroplate a copper film 217 on the surface of the copper diffusion barrier layer/seed layer stack 216, and the resulting structure is shown in FIG. 20.

Figure 21:
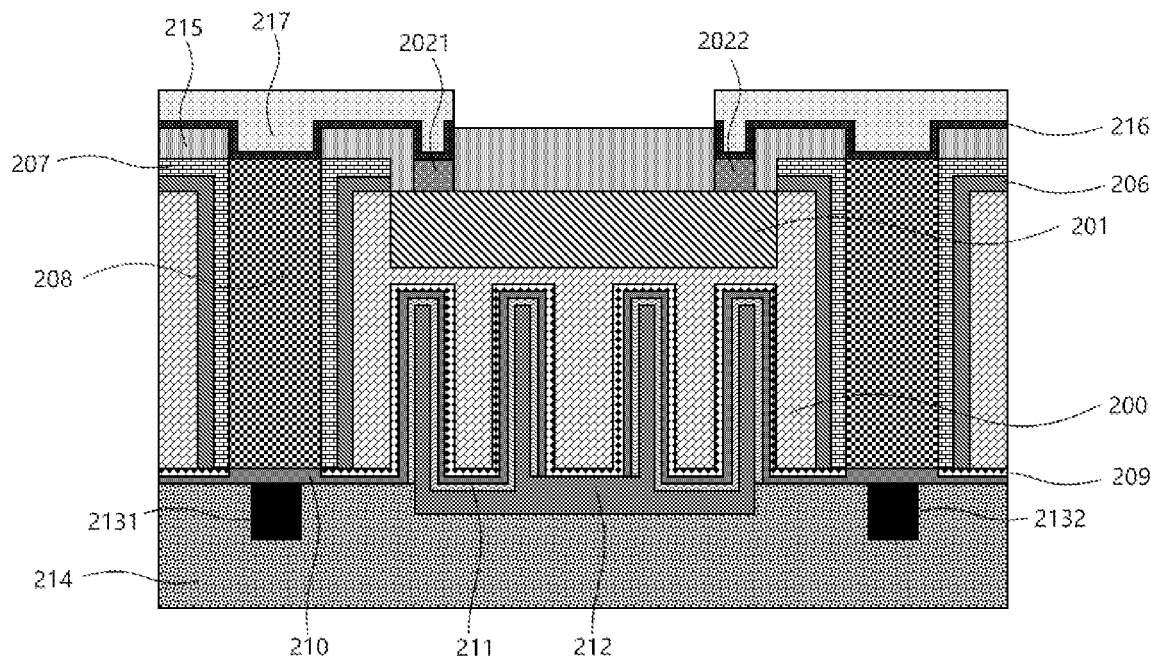

Next, a mechanical polishing process is performed to remove the copper film 217 and the copper diffusion barrier layer/seed layer stack 216 between the chip positive electrode 2021 and the chip negative electrode 2022 of the chip. The resulting structure is shown in FIG. 21.

Figure 22:
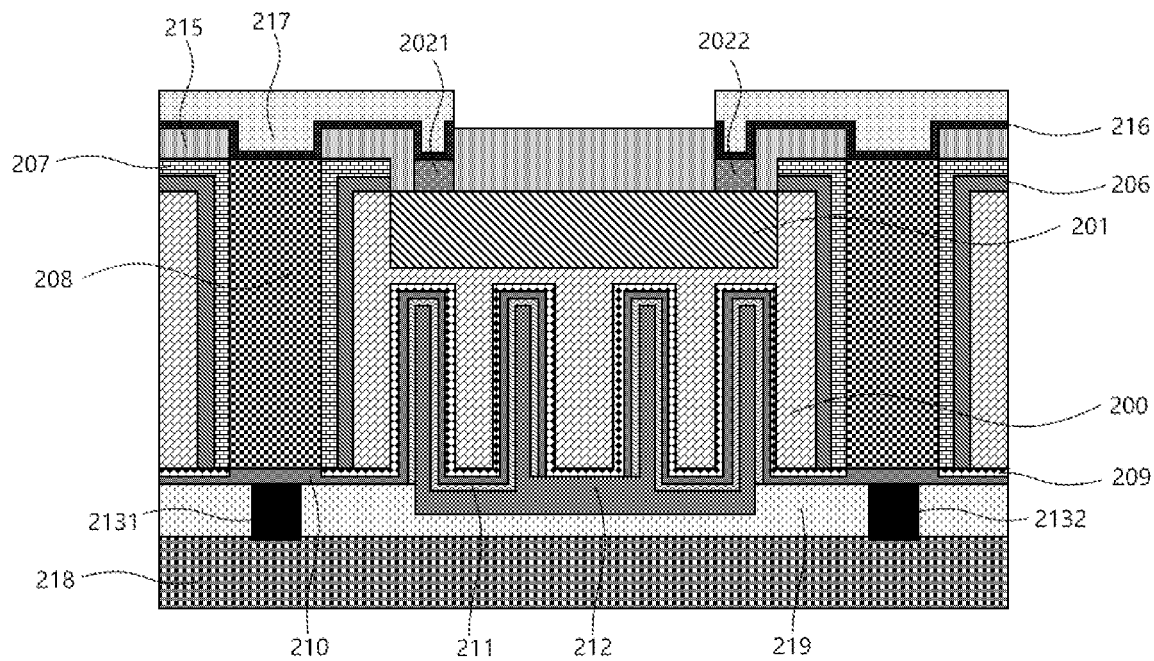

Finally, the second support carrier 214 is removed, the RFID chip/supercapacitor integration system is bonded to the surface of a packaging substrate 218, and epoxy resin 219 is filled between the RFID chip/supercapacitor integration system and the packaging substrate 218 by a backfill process. The resulting structure is shown in FIG. 22. In this embodiment, a $SiO_2$ film is used as the third insulating dielectric, and a TaN/Ru stack is used as the copper diffusion barrier layer/seed layer stack. However, the present disclosure is not limited to this, at least one of $SiO_2$, $Si_3N_4$, SiON, SiCOH, and SiCOFH can be selected as the third insulating dielectric, at least one of TaN/Ru stack, TaN/Co stack, and TaN/Ta/Cu stack can be selected as the copper diffusion barrier layer/seed stack layer. The copper diffusion barrier layer/seed layer stack 216 and the copper film 217 on the left are electrically connected to the through silicon via structure on the left and the chip positive electrode 2021. The copper diffusion barrier layer/seed layer stack 216 and the copper film 217 on the right are electrically connected to the through silicon via structure on the right side and the chip negative electrode 2022. Thus, the chip positive electrode 2021 is electrically connected with the capacitor contact positive electrode 2131 of the supercapacitor through the through silicon via structure on the left, and the chip negative electrode 2022 is electrically connected with the capacitor contact negative electrode 2132 of the supercapacitor through the through silicon via structure on the right.

As shown in FIG. 22, the three-dimensional integration system of an RFID chip and a supercapacitor of the present disclosure includes:
  a silicon substrate 200; an RFID chip 201 disposed on a front surface of the silicon substrate 200; a supercapacitor disposed on a back surface of the silicon substrate 200 at a position corresponding to the RFID chip 201, but not in contact with the RFID chip 201; through silicon via structures penetrating the silicon substrate 200 and respectively disposed on two sides of the RFID chip 201;
  wherein the RFID chip 201 has a chip positive electrode 2021 and a chip negative electrode 2022 electrically connected with a capacitor contact positive electrode 2131 and a capacitor contact negative electrode 2132 of the supercapacitor through the through silicon via structures on the two sides respectively; and
  a packaging substrate 218 electrically connected to the capacitor contact positive electrode 2131 and the capacitor contact negative electrode 2132.

In a preferred embodiment, the through silicon via structure includes:
  a through silicon via;
  a first insulating dielectric 206, a first copper diffusion barrier layer 207 and a conductive copper pillar 208, wherein the first insulating dielectric 206 covers sidewalls of the through silicon via and an upper surface of the silicon substrate 200 without covering a surface of the RFID chip 201, the first copper diffusion barrier layer 207 covers the first insulating dielectric 206; the conductive copper pillar 208 covers the first copper diffusion layer 207 on either side, and completely fills the through silicon via, the top of the conductive copper pillar 208 is flush with the top of the first copper diffusion barrier layer 207;
  a third insulating dielectric 215, a copper diffusion barrier layer/seed layer stack 216 and a copper film 217, wherein the third insulating dielectric 215 forms openings on the surfaces of the conductive copper pillar 208, the chip positive electrode 2021, and the chip negative electrode 2022; the copper diffusion barrier layer/seed layer stack 216 on the two sides respectively covers the chip positive electrode 2021 and the surface of a left area of the chip positive electrode 2021, and the chip negative electrode 2022 and the surface of a right area of the chip negative electrode 2022; the copper film 217 respectively covers the surface of the copper diffusion barrier layer/seed layer stack 216 on the two sides;
  wherein the copper diffusion barrier layer/seed layer stack 216 and the copper film 217 on the left are electrically connected to the conductive copper pillar 208 on the left and the chip positive electrode 2021; the copper diffusion barrier layer/seed layer stack 216 and the copper film 217 on the right are electrically connected to the conductive copper pillar 208 on the right and the chip negative electrode 2022.

In a preferred embodiment, the supercapacitor includes:
  a silicon nanopore structure; a second insulating dielectric 209, covering the surface of the silicon nanopore structure; a current collector 210 covering the surface of second insulating dielectric 209; pseudocapacitance material 211 covering the surface of the current collector 210; a solid electrolyte 212 covering the surface of the pseudocapacitance material 211 and completely filling the silicon nanopores;
  wherein the current collector 210 and the pseudocapacitance material 211 are separated in the middle area of the silicon nanopore structure, so that the supercapacitor is divided into two electrode areas; the second insulating dielectric 209 also covers the back area of the silicon substrate 200 except the bottoms of the conductive copper pillars 208; the current collectors 210 on the two sides also respectively cover the bottom areas of the conductive copper pillars 208;
  the capacitor contact positive electrode 2131 and the capacitor contact negative electrode 2132 are respectively disposed on the surfaces of the current collectors 210 under the conductive copper pillars 208 on the two sides.

Preferably, the insulating dielectric is $SiO_2$, SiON, SiCOH, SiCOFH, or the like. The copper diffusion barrier layer is TaN, TiN, ZrN, $MnSiO_3$, or the like. The current collector is a TaN/Ru stack, a TaN/Co stack, a TaN/Ta/Cu stack, or the like. The pseudocapacitance material is NiO, MnO, $RuO_2$, $In_2O_3$, $MoO_3$, $V_2O_5$, $SnO_2$, or the like. The solid electrolyte is PVA/KOH, $PVA/H_2SO_4$, or the like.

In the present disclosure, the RFID chip and the supercapacitor are integrated on the front and back surfaces of the same wafer, Which is beneficial to reduce the area occupied by the MID chip and the supercapacitor as a whole, so that more functional electronic devices can be integrated on the packaging substrate. At the same time, silicon materials can be fully utilized to reduce costs. In addition, utilizing through silicon vias to electrically connect the RFID chip and the supercapacitor can reduce the interconnection lines among the RFID chip, the supercapacitor and the package substrate to the minimum, thereby increasing the data transmission speed of the RFID chip and improving the effectiveness of the energy supply of the supercapacitor.

The above are only specific embodiments of the present disclosure, but the protection scope of the present disclosure is not limited thereto. Variations and substitutions that could be readily devised by any person skilled in the art should be covered within the protection scope of the present disclosure.

The invention claimed is:

1. A three-dimensional integration system of an RFID chip and a supercapacitor, comprising:
a silicon substrate;
an RFID chip disposed on a front surface of the silicon substrate;
a supercapacitor disposed on a back surface of the silicon substrate at a position corresponding to the RFID chip;
through silicon via structures penetrating the silicon substrate and respectively disposed on two sides of the RFID chip, wherein the RFID chip has a chip positive electrode and a chip negative electrode electrically connected with a capacitor contact positive electrode and a capacitor contact negative electrode of the supercapacitor through the through silicon via structures on the two sides respectively; and
a packaging substrate electrically connected to the capacitor contact positive electrode and the capacitor contact negative electrode;
the supercapacitor comprises:
a silicon nanopore structure;
a second insulating dielectric covering the surface of the silicon nanopore structure;
a current collector covering the surface of the second insulating dielectric;
pseudocapacitance material covering the surface of the current collector; and
a solid electrolyte covering the surface of the pseudocapacitance material and completely filling silicon nanopores,
wherein the current collector and the pseudocapacitance material are separated in the middle area of the silicon nanopore structure, so that the supercapacitor is divided into two electrode areas; the second insulating dielectric also covers the back area of the silicon substrate-except the bottoms of the conductive copper pillars; the current collectors on the two sides also respectively cover the bottom areas of the conductive copper pillars; the capacitor contact positive electrode and the capacitor contact negative electrode are respectively disposed on the surfaces of the current collectors under the conductive copper pillars on the two sides.

2. The three-dimensional integration system of an RFID chip and a supercapacitor according to claim 1, wherein the through silicon via structures comprise:
a through silicon via;
a first insulating dielectric, a first copper diffusion barrier layer and a conductive copper pillar, wherein the first insulating dielectric covers sidewalls of the through silicon via and an upper surface of the silicon substrate without covering a surface of the RFID chip; the first copper diffusion barrier layer covers the first insulating dielectric; the conductive copper pillar covers the first copper diffusion layer on either side, and completely fills the through silicon via, the top of the conductive copper pillar is flush with the top of the first copper diffusion barrier layer; and
a third insulating dielectric, a copper diffusion barrier layer/seed layer stack and a copper film, wherein the third insulating dielectric forms openings on the surfaces of the conductive copper pillar, the chip positive electrode, and the chip negative electrode; the copper diffusion barrier layer/seed layer stack on the two sides respectively covers the chip positive electrode and the surface of a left area of the chip positive electrode, and the chip negative electrode and the surface of a right area of the chip negative electrode; the copper film respectively covers the surface of the copper diffusion barrier layer/seed layer stack on the two sides;
wherein the copper diffusion barrier layer/seed layer stack and the copper film on the left are electrically connected to the conductive copper pillar on the left and the chip positive electrode; the copper diffusion barrier layer/seed layer stack and the copper film on the right are electrically connected to the conductive copper pillar on the right and the chip negative electrode.

3. The three-dimensional integration system of an RFID chip and a supercapacitor according to claim 1, wherein the current collector is at least one of a TaN/Ru stack, a TaN/Co stack, and a TaN/Ta/Cu stack.

4. The three-dimensional integration system of an RFID chip and a supercapacitor according to claim 1, wherein the pseudocapacitance material is at least one of NiO, MnO, $RuO_2$, $In_2O_3$, $MoO_3$, $V_2O_5$, and $SnO_2$.

\* \* \* \* \*